United States Patent
Tanio et al.

(10) Patent No.: US 10,187,092 B2
(45) Date of Patent: Jan. 22, 2019

(54) DIGITAL TRANSMITTER

(71) Applicant: NEC Corporation, Minato-ku, Tokyo (JP)

(72) Inventors: Masaaki Tanio, Tokyo (JP); Shinichi Hori, Tokyo (JP); Tomoyuki Yamase, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/760,683

(22) PCT Filed: Sep. 23, 2016

(86) PCT No.: PCT/JP2016/077937
§ 371 (c)(1),
(2) Date: Mar. 16, 2018

(87) PCT Pub. No.: WO2017/057164
PCT Pub. Date: Apr. 6, 2017

(65) Prior Publication Data
US 2018/0262219 A1    Sep. 13, 2018

(30) Foreign Application Priority Data
Oct. 1, 2015   (JP) .................................. 2015-195894

(51) Int. Cl.
*H03F 3/19*   (2006.01)
*H04B 1/02*   (2006.01)
(Continued)

(52) U.S. Cl.
CPC .................. *H04B 1/02* (2013.01); *H03F 3/19* (2013.01); *H03F 3/211* (2013.01); *H03K 5/133* (2013.01);
(Continued)

(58) Field of Classification Search
USPC ........................ 375/219, 220, 221, 222, 229, 375/240.26–240.28, 259, 285, 295, 316,
(Continued)

(56) References Cited

U.S. PATENT DOCUMENTS 6,724,832 B1 * 4/2004 Hershberger ............ H03C 1/60
348/723
9,124,310 B2 * 9/2015 Mostafa ............... H04B 1/0064
(Continued)

FOREIGN PATENT DOCUMENTS

JP    2011-077741 A    4/2011
JP    2011-086983 A    4/2011
(Continued)

OTHER PUBLICATIONS

A. Frappe et al., "An All-Digital RF Signal Generator Using High-Speed Delta-Sigma Modulators", IEEE Journal of Solid-State Circuits, Oct. 2009, pp. 2722-2732, vol. 44, No. 10.
(Continued)

*Primary Examiner* — Linda Wong

(57) ABSTRACT

In a digital transmitter, a digital RF signal generation unit executes digital modulation on I and Q signals to convert the I and Q signal into first and second digital RF signals, respectively, with a bit rate which is twice a carrier frequency. A retiming unit delays the first digital RF signal according to a clock signal with a frequency which is 4n times (n is an integer) the carrier frequency to output the delayed first digital RF signal and delays the phase of the second digital RF signal by 90 degrees with respect to an output of the first digital RF signal to output the delayed second digital RF signal. First and second amplifiers amplify the first and second digital RF signals output by the retiming
(Continued)

unit, respectively. A combiner combines the amplified first and second digital RF signals to generate one signal sequence.

10 Claims, 9 Drawing Sheets

(51) Int. Cl.
| | |
|---|---|
| H04M 1/60 | (2006.01) |
| H03K 5/133 | (2014.01) |
| H03K 5/135 | (2006.01) |
| H04L 27/20 | (2006.01) |
| H04B 1/00 | (2006.01) |
| H03F 3/21 | (2006.01) |
| H03K 5/00 | (2006.01) |

(52) U.S. Cl.
CPC .............. *H03K 5/135* (2013.01); *H04L 27/20* (2013.01); *H03F 2200/171* (2013.01); *H03F 2200/331* (2013.01); *H03F 2200/336* (2013.01); *H03F 2200/451* (2013.01); *H03F 2203/21106* (2013.01); *H03F 2203/21142* (2013.01); *H03F 2203/21157* (2013.01); *H03K 2005/00019* (2013.01); *H03K 2005/00234* (2013.01); *H04M 1/6008* (2013.01)

(58) Field of Classification Search
USPC ........ 375/354, 355, 371, 362, 364, 302, 307
See application file for complete search history.

(56) References Cited

U.S. PATENT DOCUMENTS

| | | | | |
|---|---|---|---|---|
| 9,350,578 | B2* | 5/2016 | Kusunoki | H04L 25/4902 |
| 9,838,068 | B2* | 12/2017 | Kunihiro | H03F 3/217 |
| 2001/0016016 | A1* | 8/2001 | Eidson | H03C 3/40 |
| | | | | 375/302 |
| 2005/0152469 | A1* | 7/2005 | Fusco | H03C 3/403 |
| | | | | 375/295 |
| 2006/0183440 | A1* | 8/2006 | Morris | H04B 1/0483 |
| | | | | 455/103 |
| 2007/0159245 | A1* | 7/2007 | Kim | H03F 1/3223 |
| | | | | 330/149 |
| 2010/0104043 | A1* | 4/2010 | Farrell | H03F 3/2175 |
| | | | | 375/296 |
| 2010/0124290 | A1* | 5/2010 | Kablotsky | H04L 27/36 |
| | | | | 375/259 |
| 2010/0128829 | A1* | 5/2010 | Drugge | H04L 27/0014 |
| | | | | 375/354 |
| 2011/0069784 | A1* | 3/2011 | Petilli | H04B 1/001 |
| | | | | 375/296 |
| 2012/0262214 | A1 | 10/2012 | Hori | |
| 2013/0142283 | A1* | 6/2013 | Hori | H03F 1/0222 |
| | | | | 375/300 |
| 2014/0077983 | A1* | 3/2014 | Podsiadlik | H03F 3/2175 |
| | | | | 341/143 |
| 2015/0071338 | A1* | 3/2015 | Talwalkar | H04L 27/36 |
| | | | | 375/238 |
| 2016/0047916 | A1* | 2/2016 | Pearse | G01S 19/21 |
| | | | | 342/357.59 |
| 2016/0094378 | A1* | 3/2016 | Guerra | H04L 27/364 |
| | | | | 375/298 |
| 2016/0192084 | A1* | 6/2016 | Oliaei | H04R 3/06 |
| | | | | 367/135 |
| 2016/0295535 | A1* | 10/2016 | Jose | H04L 7/0037 |

FOREIGN PATENT DOCUMENTS

| | | |
|---|---|---|
| JP | 5360232 B2 | 12/2013 |
| WO | 2015/114702 A1 | 8/2015 |

OTHER PUBLICATIONS

T. Maehata et al., "High ACLR 1-bit Direct Radio Frequency Converter Using Symmetric Waveform", Proceedings of the 42nd European Microwave Conference, Nov. 2012, pp. 1051-1054.

A. Frappe et al., "Design techniques for very high speed digital delta-sigma modulators aimed at all-digital RF transmitters", Electronics, Circuits and Systems, 2006, ICECS'06.13th IEEE International Conference on, Jul. 2006, pp. 1113-1116.

International Search Report for PCT Application No. PCT/JP2016/077937, dated Dec. 13, 2016.

* cited by examiner

DIGITAL TRANSMITTER

This application is a National Stage Entry of PCT/JP2016/077937 filed on Sep. 23, 2016, which claims priority from Japanese Patent Application 2015-195894 filed on Oct. 1, 2015, the contents of all of which are incorporated herein by reference, in their entirety.

TECHNICAL FIELD

The present invention relates to a digital transmitter.

BACKGROUND ART

In recent years, digital transmitters in which $\Delta\Sigma$ modulators and class D amplifiers are combined have attracted attention as transmitters for which high power efficiency is expected. The $\Delta\Sigma$ modulators using $\Delta\Sigma$ modulation schemes have actively been studied because hardware implementation is easy.

Patent Document 1 and Non Patent Document 1 disclose technologies for $\Delta\Sigma$ modulators using low-pass $\Delta\Sigma$ modulation schemes as related technologies.

Patent Document 2 discloses a technology for a $\Delta\Sigma$ modulator using an envelope $\Delta\Sigma$ modulation scheme as a related technology.

Non-Patent Document 2 discloses a technology for a $\Delta\Sigma$ modulator using a band-pass $\Delta\Sigma$ modulation scheme as a related technology.

CITATION LIST

Patent Document

[Patent Document 1]
Japanese Unexamined Patent Application, First Publication No. 2011-086983
[Patent Document 2]
Japanese Patent No. 5360232

Non-Patent Document

[Non-Patent Document 1]
Antoine Frappe, "An All-Digital RF Signal Generator Using High-Speed Modulators," IEEE JOURNAL OF SOLID-STATE CIRCUITS, VOL. 44, NO. 10, pp. 2722 to 2732, 2009.
[Non-Patent Document 2]
T. Maehata, S. Kameda, and N. Suematsu, "High ACLR 1-bit Direct Radio Frequency Converter Using Symmetric Waveform," Proc. 42nd European Microwave Conf., pp. 1051 to 1054, November 2012.

SUMMARY OF INVENTION

Technical Problem

Of the $\Delta\Sigma$ modulators using the above-described modulation schemes, the $\Delta\Sigma$ modulators using the low-pass $\Delta\Sigma$ modulation scheme have been actively studied because hardware implementation is easy.

In general, in a $\Delta\Sigma$ modulator using the low-pass $\Delta\Sigma$ modulation scheme, a bit rate of a signal to be output is restricted to four times a carrier frequency fc. Therefore, an expensive device capable of operating at a high speed is necessary. As a result, it is difficult to realize a $\Delta\Sigma$ modulator using the low-pass $\Delta\Sigma$ modulation scheme with a cheap general integrated circuit (IC) such as a field-programmable gate array (FPGA). An expensive dedicated IC such as an application specific integrated circuit (ASIC) capable of operating at a high speed is necessary.

In general, many $\Delta\Sigma$ modulators using the low-pass $\Delta\Sigma$ modulation scheme are divided into digital circuits and analog circuits at the time of manufacturing so that noise occurring in the digital circuits is not mixed into signals of the analog circuits. Specifically, a block on the front stage of an amplifier is manufactured as a digital circuit and a block on the rear stage of the amplifier is manufactured as an analog circuit. The digital circuit and the analog circuit are manufactured as different ICs. Then, the IC of the digital circuit and the IC of the analog circuit are connected on circuit substrates by a bonding wire or flip-chip mounting.

When there is a variation in a length between a wiring for propagating an I signal sequence and a wiring for propagating a Q signal sequence in the connection of the IC of the digital circuit and the IC of the analog circuit on the circuit substrate, a deviation in propagation delay between the I and Q signals, jitter, or a collapse (rounding) of a pulse waveform due to an influence of a parasitic component in the wiring occurs. The deviation in the delay, the jitter, or the collapse of the pulse waveform also has an influence on a block on the rear stage on an output of the amplifier, thereby distorting a signal output from an antenna.

In a transmitter disclosed in the above-described Patent Document 1, a bit rate of a signal output by a digital RF signal generator can be reduced from four times the carrier frequency fc to twice the carrier frequency fc, thereby reducing a manufacturing cost. The transmitter disclosed in Patent Document 1 includes a predistortion correction circuit that removes distortion caused due to a time difference between a time taken in an arithmetic operation process for the I signal and a time taken in an arithmetic operation process for the Q signal. However, the predistortion correction circuit of the transmitter disclosed in Patent Document 1 is installed on the front stage of the digital RF signal generator and corrects the time difference between the times taken in the arithmetic operation occurring in principle even in the case of ideal wirings. For this reason, in the predistortion correction circuit of the transmitter disclosed in Patent Document 1, it is difficult to improve distortion of a signal occurring when the IC of the digital circuit and the IC of the analog circuit described above are connected to each other.

Accordingly, an object of the present invention is to provide a digital transmitter capable of resolving the foregoing problem.

Solution to Problem

In order to achieve the foregoing object, there is provided a digital transmitter including: a digital RF signal generation unit configured to execute digital modulation on an I signal which is an input baseband signal to convert the I signal into a first digital RF signal with a bit rate which is twice a carrier frequency and execute digital modulation on a Q signal which is an input baseband signal to convert the Q signal into a second digital RF signal with a bit rate which is twice the carrier frequency; a retiming unit configured to delay the first digital RF signal according to a first clock signal with a frequency which is 4n times the carrier frequency to output the delayed first digital RF signal and delay the phase of the second digital RF signal by 90 degrees with respect to an output of the first digital RF signal to output the delayed second digital RF signal, n being an integer; a first amplifier configured to amplify the first digital RF signal output by the retiming unit; a second amplifier configured to amplify the second digital RF signal output by the retiming unit; and a combiner configured to combine the first digital RF signal amplified by the first amplifier and the second digital RF signal amplified by the second amplifier to generate one signal sequence.

Advantageous Effects of Invention

According to the present invention, it is possible to reduce a manufacturing cost and improve distortion characteristics.

DESCRIPTION OF EMBODIMENTS

Hereinafter, embodiments will be described in detail with reference to the drawings.

First Embodiment

A configuration of a digital transmitter 10 according to a first embodiment of the present invention will be described.

Figure 1:
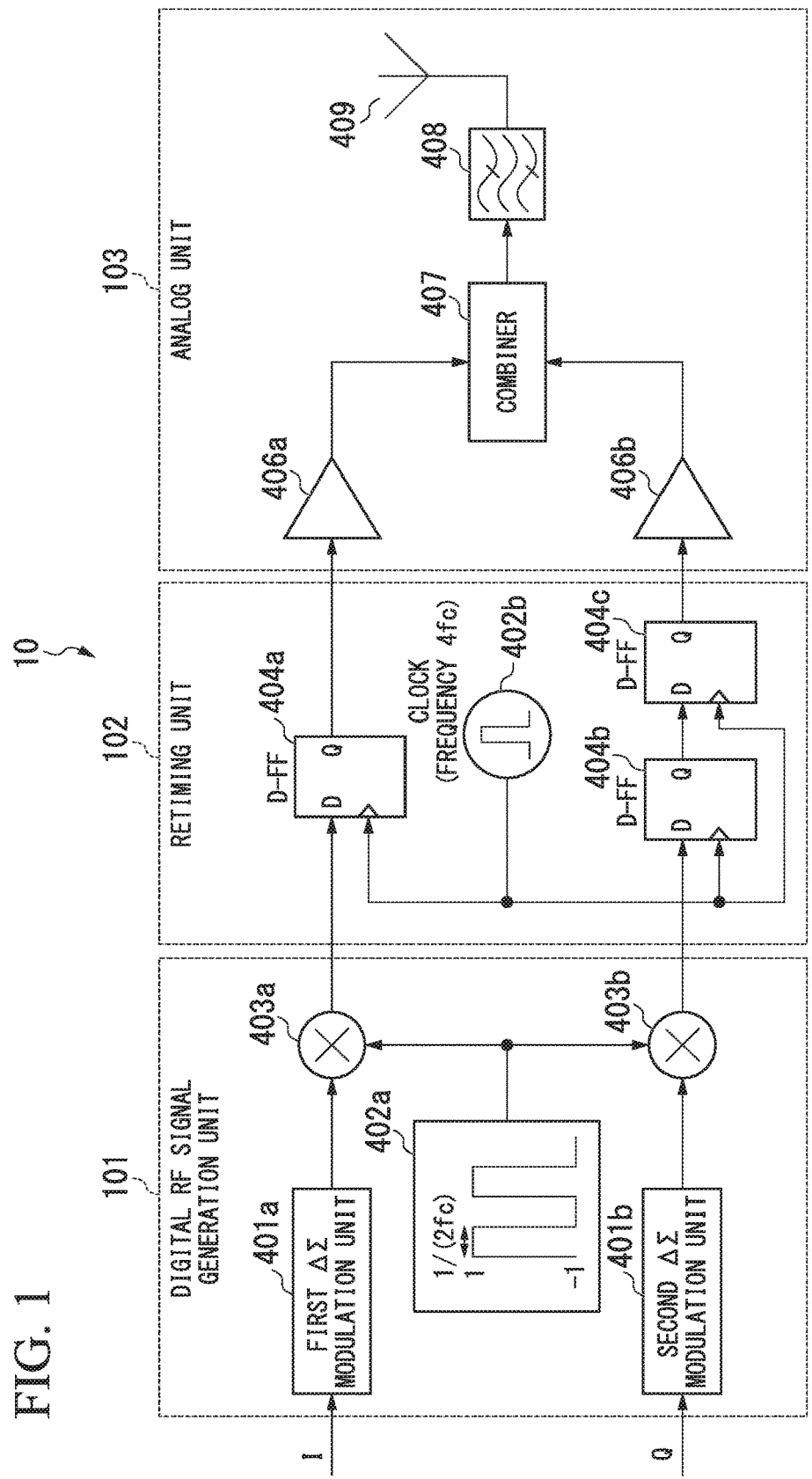
FIG. 1 is a diagram showing a configuration of a digital transmitter according to a first embodiment of the present invention.

As shown in FIG. 1, the digital transmitter 10 according to the first embodiment includes a digital radio frequency (RF) signal generation unit 101, a retiming unit 102, and an analog unit 103.

The digital RF signal generation unit 101 includes a first ΔΣ modulation unit 401a, a second ΔΣ modulation unit 401b, a first clock generation unit 402a, a first digital mixer unit 403a, and a second digital mixer unit 403b.

The first ΔΣ modulation unit 401a inputs an in-phase (I), signal which is a baseband signal. The first ΔΣ, modulation unit 401a executes ΔΣ modulation on the input I signal. Specifically, the first ΔΣ modulation unit 401a quantizes the I signal with a low-pass ΔΣ modulator or a pulse width modulation (PWM) modulator. The first ΔΣ modulation unit 401a outputs a modulation result to the first digital mixer unit 403a.

The second ΔΣ modulation unit 401b inputs a quadrature (Q) signal which is a baseband signal. The second ΔΣ modulation unit 401b executes ΔΣ modulation on the input Q signal. Specifically, the second ΔΣ modulation unit 401b quantizes the Q signal with a low-pass ΔΣ modulator or a PWM modulator. The second ΔΣ modulation unit 401b outputs a modulation result to the second digital mixer unit 403b.

When the first ΔΣ modulation unit 401a and the second ΔΣ modulation unit 401b quantize the I and Q signals with the low-pass ΔΣ modulators, for example, the technology disclosed in Non-Patent Document 1 may be used.

The first clock generation unit 402a generates a first clock signal in which binary values (1 and −1) repeatedly alternate with the same frequency as a carrier frequency fc. The first clock generation unit 402a outputs the generated first clock signal to the first digital mixer unit 403a and the second digital mixer unit 403b.

The first digital mixer unit 403a inputs the modulation result from the first ΔΣ modulation unit 401a. The first digital mixer unit 403a inputs a first clock signal from the first clock generation unit 402a. The first digital mixer unit 403a executes a digital operation of multiplying the input modulation result by the first clock signal. The first digital mixer unit 403a outputs a digital operation result to the retiming unit 102.

The second digital mixer unit 403b inputs the modulation result from the second ΔΣ modulation unit 401b. The second digital mixer unit 403b inputs the first clock signal from the first clock generation unit 402a. The second digital mixer unit 403b executes a digital operation of multiplying the input modulation result by the first clock signal. The second digital mixer unit 403b outputs a digital operation result to the retiming unit 102.

The retiming unit 102 includes a second clock generation unit 402b, a D flip-flop (hereinafter referred to as "D-FF") 404a, a D-FF 404b, and a D-FF 404c.

The second clock generation unit 402b generates a second clock signal in which binary values (1 and −1) repeatedly alternate with a frequency 4fc which is four times the carrier frequency fc. The second clock generation unit 402b outputs the generated second clock signal to each of the D-FF 404a, the D-FF 404b, and the D-FF 404c.

The D-FF 404a inputs the digital operation result from the first digital mixer unit 403a. The D-FF 404a inputs the second clock signal from the second clock generation unit 402b. The D-FF 404a outputs, to the analog unit 103, a delay signal obtained by delaying the input digital operation result according to the second clock signal.

The D-FF 404b inputs the digital operation result from the second digital mixer unit 403b. The D-FF 404b inputs the second clock signal from the second clock generation unit 402b. The D-FF 404b outputs, to the D-FF 404c, a delay signal obtained by delaying the input digital operation result according to the second clock signal.

The D-FF 404c inputs the delay signal from the D-FF 404b. The D-FF 404c inputs the second clock signal from the second clock generation unit 402b. The D-FF 404c outputs, to the analog unit 103, a delay signal obtained by further delaying the input delay signal according to the second clock signal.

The analog unit 103 includes a first amplifier 406a, a second amplifier 406b, a combiner 407, a band-pass filter 408, and an antenna 409.

The first amplifier 406a inputs the delay signal from the D-FF 404a. The first amplifier 406a amplifies the input delay signal. The first amplifier 406a outputs the amplified delay signal to the combiner 407.

The second amplifier 406b inputs the delay signal from the D-FF 404c. The second amplifier 406b amplifies the input delay signal. The second amplifier 406b outputs the amplified delay signal to the combiner 407.

The first amplifier 406a and the second amplifier 406b may each be a class D amplifier that realizes highly efficient amplification through a switching operation. However, the first amplifier 406a and the second amplifier 406b are not limited to class D amplifiers. The first amplifier 406a and the second amplifier 406b may each be, for example, a class AB amplifier, a class B amplifier, a class E amplifier, a class F amplifier, a Doherty amplifier, or an envelope tracking amplifier.

The combiner 407 inputs the delay signals output from the D-FF 404a and D-FF 404c and amplified by the first amplifier 406a and the second amplifier 406b. The combiner 407 combines the two input delay signals to generate a combined signal. Since a value of the delay signal is "1" or "4," a value of the combined signal is "2," "0," or "−2." For example, the combiner 407 generates the combined signal of "2" when the delay signal of "1" is input from the D-FF 404a and the delay signal of "1" is input from the D-FF 404c. The combiner 407 generates the combined signal of "−2" when the delay signal of "−1" is input from the D-FF 404a and the delay signal of "−1" is input from the D-FF 404c. The combiner 407 generates the combined signal of "0" when the mutually different delay signals of "1" and "−1" are input from the D-FF 404a and the D-FF 404c. The combiner 407 outputs the generated combined signal to the band-pass filter 408.

The combiner 407 may be a power combiner such as a Wilkinson combiner. However, the combiner 407 is not limited to a power combiner. The combiner 407 may be, for example, a voltage combiner or a current combiner.

The band-pass filter 408 inputs the combined signal from the combiner 407. The band-pass filter 408 outputs, to the antenna 409, a band-pass output signal in which a component other than a frequency component near the carrier frequency fc in the input combined signal is suppressed.

The band-pass filter 408 may be a band-pass filter with any configuration as long as the band-pass filter passes a band-pass output signal in which a component other than a frequency component near the carrier frequency fc in the input combined signal is suppressed.

The antenna 409 radiates electromagnetic waves to a space according to the band-pass output signal output from the band-pass filter 408.

The antenna 409 may be any antenna as long as the antenna radiates electromagnetic waves to the space according to the band-pass output signal output from the band-pass filter 408.

The retiming unit 102 is a functional unit that delays an RF signal (a second digital RF signal) corresponding to the I signal by a time equivalent to a phase of 90 degrees with respect to an RF signal (a first digital RF signal) corresponding to the Q signal according to the second clock signal. The retiming unit 102 is not limited to the number of D-FF stages as long as the RF signal corresponding to the Q signal is delayed with respect to the RF signal corresponding to the I signal by a time equivalent to the phase of 90 degrees according to the second clock signal.

The example of the configuration in which the D-FFs are used in the circuit in which the RF signal corresponding to the Q signal is delayed with respect to the RF signal corresponding to the I signal by the time equivalent to the phase of 90 degrees according to the second clock signal has been described as the configuration of the retiming unit 102. However, the configuration of the retiming unit 102 in which the D-FFs are used in the circuit in which the RF signal corresponding to the Q signal is delayed with respect to the RF signal corresponding to the I signal by the time equivalent to the phase of 90 degrees according to the second clock signal is not limited to the configuration in which the D-FFs are used. A latch circuit, a flip-flop other than the D flip-flop, a latch circuit, or the like may be used as long as the circuit has the same function as the D-FFs.

The second clock signal with the frequency 4fc may be a clock signal generated by the second clock generation unit 402b by multiplying a clock signal with a frequency 2fc by 2. However, the second clock signal with the frequency 4fc is not limited to the clock signal generated by the second clock generation unit 402b by multiplying the clock signal with the frequency 2fc by 2. The second clock signal with the frequency 4fc may be, for example, a clock signal generated by multiplying the first clock signal with the frequency fc generated by the first clock generation unit 402a by 4. The second clock signal with the frequency 4fc may be, for example, a clock signal generated from a clock signal with a frequency 4n·fc, where n is a positive integer. The second clock signal with the frequency 4fc may be generated in any way as long as the second clock signal has a frequency which is four times the frequency of the first clock signal and a rising timing of the second clock signal is synchronized with a rising timing of the first clock signal every four periods.

Figure 2:
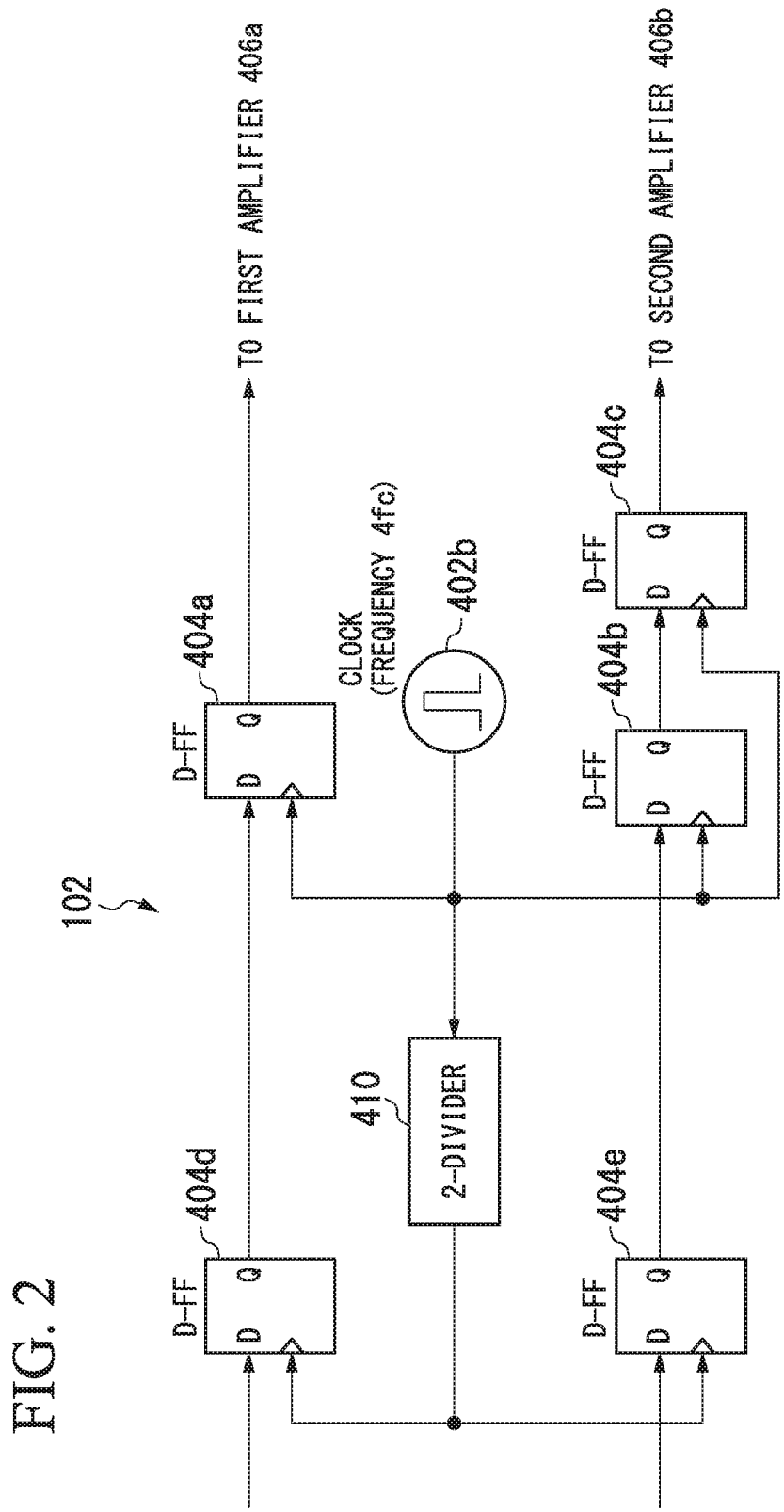
FIG. 2 is a diagram showing another configuration of a retiming unit according to the first embodiment.

A bit rate of the signal input to the retiming unit 102 is 2fc [Hz]·[bit]. Therefore, as shown in FIG. 2, the retiming unit 102 may include a D-FF 404d, a D-FF 404e, and a 2-divider 410 in addition to the configuration of the retiming unit 102 shown in FIG. 1.

In this case, the 2-divider 410 generates a clock signal with a frequency 2fc obtained by dividing the clock signal with the frequency 4fc generated by the second clock generation unit 402b. The 2-divider 410 outputs the generated clock signal with the frequency 2fc to the D-FF 404d and the D-FF 404e.

The D-FF 404d inputs the digital operation result from the first digital mixer unit 403a. The D-FF 404d outputs, to the D-FF 404a, the delay signal obtained by delaying the input digital operation result according to the clock signal with the frequency 2fc input from the 2-divider 410.

The D-FF 404e inputs the digital operation result from the second digital mixer unit 403b. The D-FF 404e outputs, to the D-FF 404b, the delay signal obtained by delaying the input digital operation result according to the clock signal with the frequency 2fc input from the 2-divider 410. The D-FF 404a, the D-FF 404b, and the D-FF 404c each output the delay signals delayed according to the clock signal with the frequency 4fc generated by the second clock generation unit 402b, as described above.

The process of the digital transmitter 10 according to the first embodiment of the present invention has been described. In the above-described digital transmitter 10, the digital RF signal generation unit 101 executes the digital modulation on the I signal which is the input baseband signal to convert the I signal into the first digital RF signal with the bit rate which is twice the carrier frequency and executes the digital modulation on the Q signal which is the input baseband signal to convert the Q signal into the second digital RF signal with the bit rate which is twice the carrier frequency. The retiming unit 102 delays the first digital RF signal according to the clock signal with the frequency which is 4n times (where n is a positive integer) the carrier frequency to output the delayed first digital RF signal and delays the phase of the second digital RF signal by 90 degrees with respect to the output of the first digital RF signal to output the delayed second digital RF signal. The first amplifier 406*a* amplifies the first digital RF signal output by the retiming unit 102. The second amplifier 406*b* amplifies the second digital RF signal output by the retiming unit 102. The combiner 407 combines the first digital RF signal amplified by the first amplifier 406*a* and the second digital RF signal amplified by the second amplifier 406*b* to generate one signal sequence.

In this way, the digital transmitter 10 can reduce the bit rate of the signal output by the digital RF signal generation unit 101 from four times the carrier frequency fc to twice the carrier frequency fc, and thus it is possible to reduce a manufacturing cost using a device for a low-frequency operation. In the digital transmitter 10, the retiming unit 102 which is a connection unit of the digital circuit and the analog circuit can delay the phase of the second digital RF signal corresponding to the Q signal by 90 degrees with respect to the first digital RF signal corresponding to the I signal according to the clock signal with the frequency which is 4n times the carrier frequency generated by the second clock generation unit, thereby improving distortion characteristics.

Second Embodiment

A digital transmitter 10 according to a second embodiment of the present invention will be described.

In the digital transmitter 10 according to the first embodiment of the present invention, there is a possibility of timings of an I data sequence and a Q data sequence input to the D-FFs included in the retiming unit 102 deviating from desired timings due to a variation or the like in a transmission line length between the I signal and the Q signal between the digital RF signal generation unit 101 and the retiming unit 102.

Figure 3:
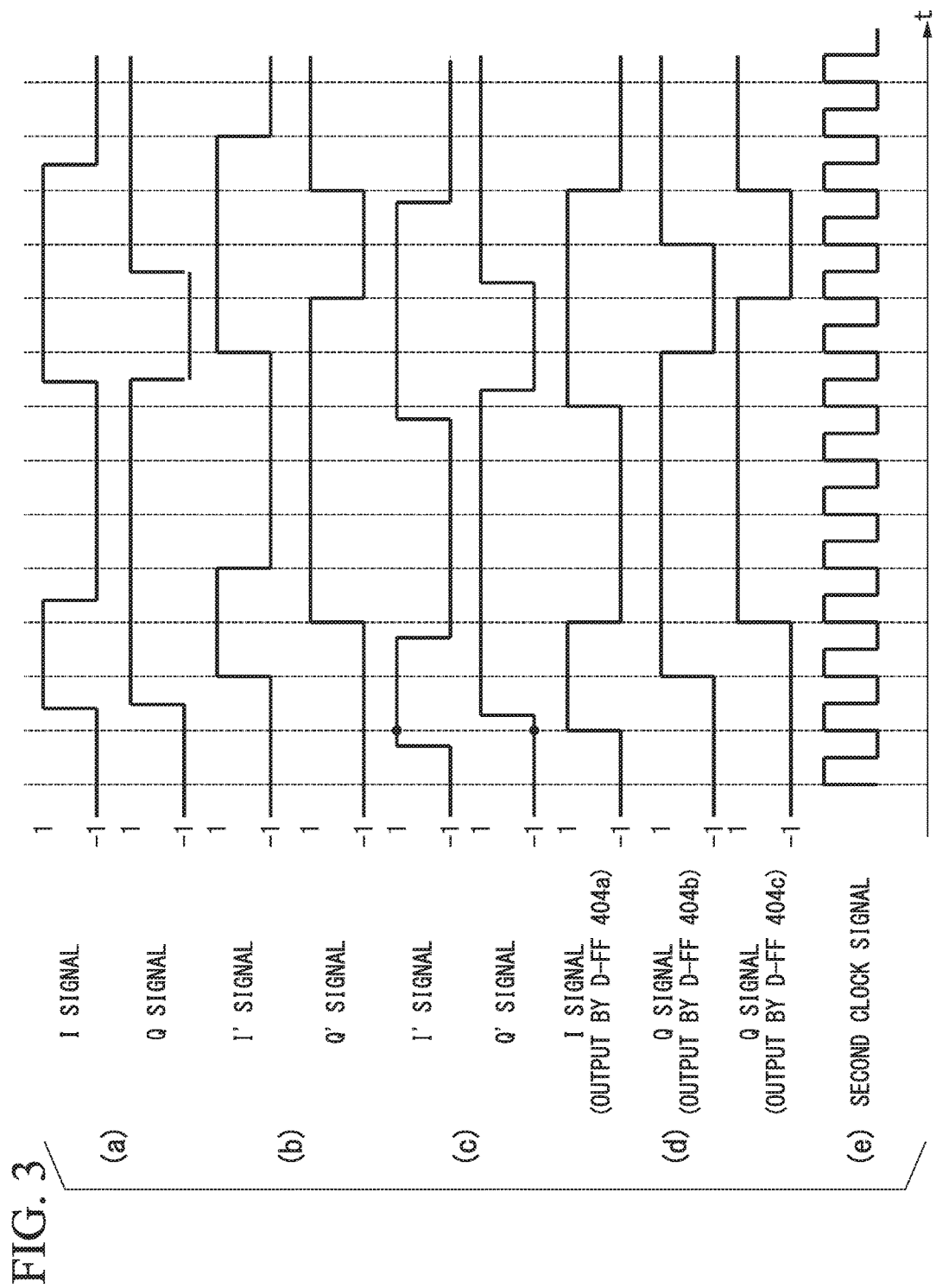
FIG. 3 is a diagram showing a sampling timing in the digital transmitter.

For example, when the digital RF signal generation unit 101 outputs I/Q signals (a) in FIG. 3, desired output signals of the retiming unit 102 are I'/Q' signals (b) in FIG. 3. However, when the retiming unit 102 inputs I'/Q' signals (c) in FIG. 3, signals output by the D-FFs included in the retiming unit 102 may be I/Q signals (d) in FIG. 3, and thus may not be signals at desired timings as in the I'/Q' signals (b) in FIG. 3.

The digital transmitter 10 according to the second embodiment corrects a deviation in a desired timing which is likely to occur due to a variation or the like in the transmission line length between the I signal and the Q signal.

A configuration of the digital transmitter 10 according to the second embodiment will be described.

Figure 4:
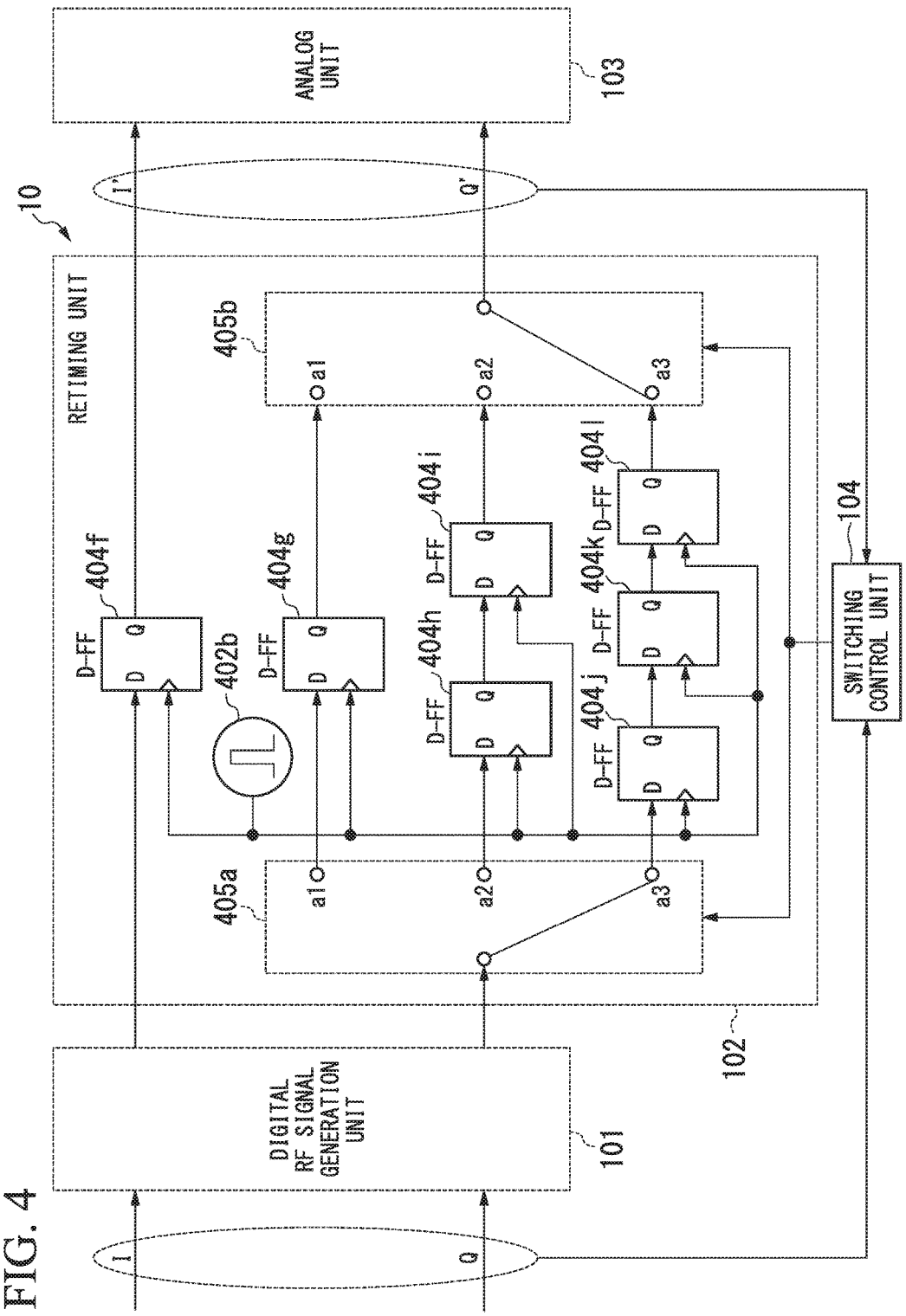
FIG. 4 is a first diagram showing a configuration of a digital transmitter according to a second embodiment of the present invention.

As shown in FIG. 4, the digital transmitter 10 according to the second embodiment includes a digital RF signal generation unit 101, a retiming unit 102, an analog unit 103, and a switching control unit 104.

The digital RF signal generation 101 according to the second embodiment is the same as the digital RF signal generation unit 101 according to the first embodiment. The analog unit 103 according to the second embodiment is the same as the analog unit 103 according to the first embodiment.

The digital transmitter 10 according to the second embodiment is different from the digital transmitter 10 according to the first embodiment in the retiming unit 102 and the switching control unit 104.

The switching control unit 104 inputs an I signal and a Q signal from the digital RF signal generation unit 101. The switching control unit 104 inputs two signals, an I' signal corresponding to the I signal output by the retiming unit 102 and a Q' signal corresponding to the Q signal. The switching control unit 104 generates a switching control signal for switching each of switches 405*a* and 405*b* according to four signals, the input I, Q, I', and Q' signals.

A method in which the switching control unit 104 selects a route from routes a1, a2, and a3 in the switches 405*a* and 405*b* is, for example, a method to be described below.

The switching control unit 104 generates a switching control signal for selecting the route a2 as an initial switching control signal. The switching control unit 104 outputs the generated switching control signal to each of the switches 405*a* and 405*b*. In this state, it is considered that the switching control unit 104 inputs a signal in which a maximum value of 1 (or a minimum value of −1) of each of the I signal and the Q signal continues, that is, an I/Q signal (a) in FIG. 5.

The digital RF signal generation unit 101 outputs the I signal and the Q signal synchronized with the first clock signal to the retiming unit 102.

The retiming unit 102 inputs the I signal and the Q signal synchronized with the first clock signal from the digital RF signal generation unit 101. The retiming unit 102 outputs the I' signal and the Q' signal to the switching control unit 104 according to the second clock signal (e) shown in FIG. 5. At this time, the I' signal and the Q' signal which the retiming unit 102 should output to the switching control unit 104 are the I'/Q' signals (b) of FIG. 5 and are assumed to be the I' signal and the Q' signal of which the phase is delayed by 90 degrees with respect to the I' signal so that the Q' signal rises one clock after the I' signal rises.

The switching control unit 104 continuously outputs the switching control signal for selecting the route a2 when the I' signal and the Q' signal input from the retiming unit 102 are signals with desired phase difference.

Figure 5:
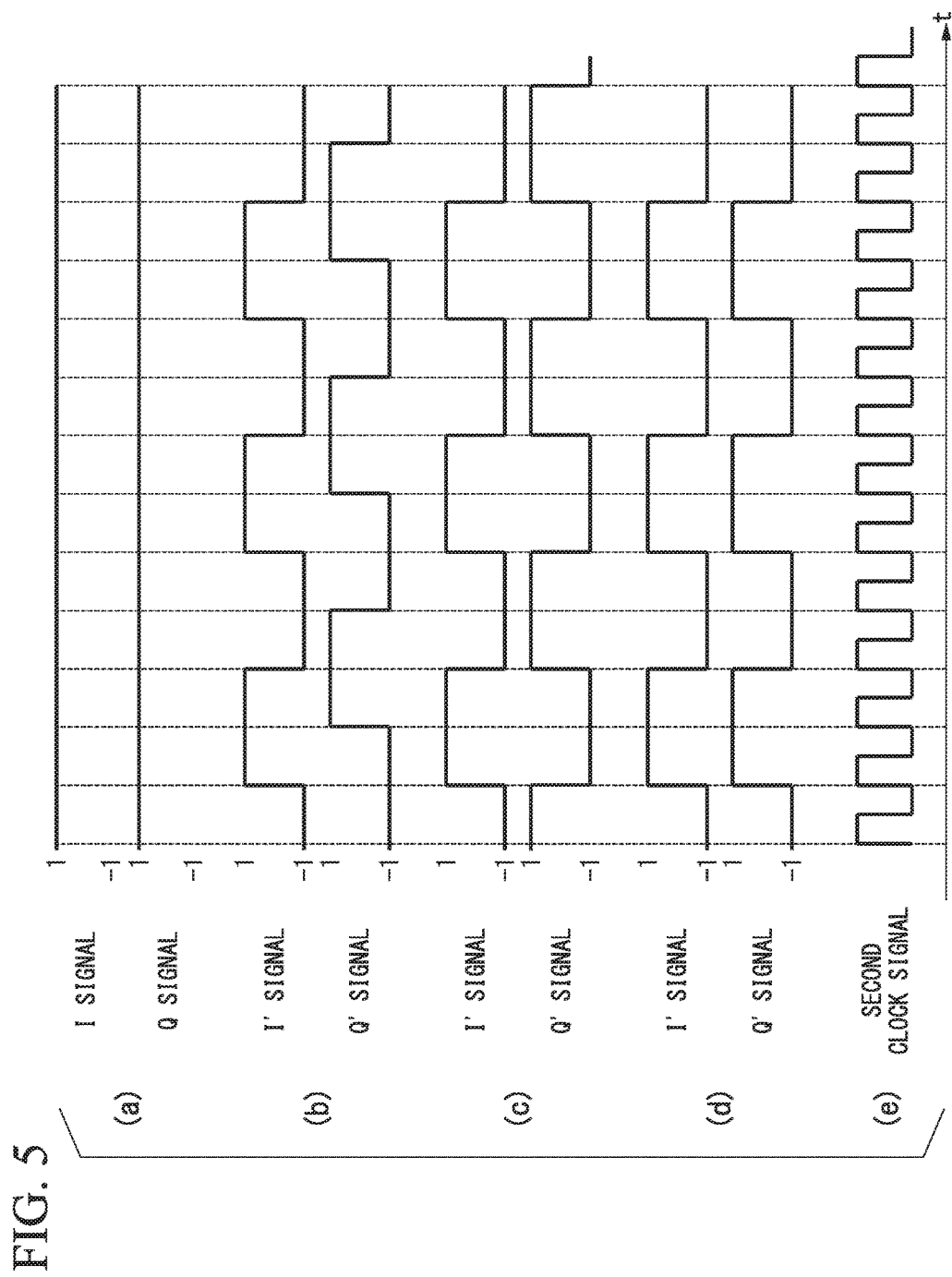
FIG. 5 is a diagram showing a method in which a switching control unit selects a route according to the second embodiment.

When the I' signal and the Q' signal input from the retiming unit 102 are inverted signals such as the I'/Q' signals (c) in FIG. 5, that is, the phase of the Q' signal is further delayed by 180 degrees from that of the I' signal, the switching control unit 104 generates the switching control signal for selecting the route a1 and outputs the switching control signal to each of the switches 405*a* and 405*b* in order to advance an output timing of the Q' signal by one clock.

When the I' signal and the Q' signal input from the retiming unit 102 are the same signals such as the I'/Q' signals (d) in FIG. 5, that is, the phase of the Q' signal is 0 degrees with respect to the I' signal, the switching control unit 104 generates the switching control signal for selecting the route a3 and outputs the switching control signal to each of the switches 405*a* and 405*b* in order to delay an output timing of the Q' signal by one clock.

As the method in which the above-described switching control unit 104 selects the route, the case in which the maximum value of 1 or the minimum value of −1 of the I signal and the Q signal input to the digital RF signal generation unit 101 continues has been described as an example, but the present invention is not limited thereto. A method in which the switching control unit 104 selects a route from the routes a1, a2, and a3 in the switches 405*a* and 405*b* may be, for example, a method of changing the I signal and the Q signal so that the values are the same, determining whether the I' signal and the Q' signal input from the retiming unit 102 have a desired phase difference, and selecting the route in the above-described way.

The retiming unit 102 according to the second embodiment includes a second clock generation unit 402*b*, a D-FFs 404*f*, 404*g*, 404*h*, 404*i*, 404*j*, 404*k*, and 404*l*, and the switches 405*a* and 405*b*, as shown in FIG. 4.

The D-FF 404*f* inputs a digital operation result from the first digital mixer unit 403*a* included in the digital RF signal generation unit 101. The D-FF 404*f* inputs the second clock signal from the second clock generation unit 402*b*. The D-FF 404*f* outputs a delay signal obtained by delaying the input digital operation result according to the second clock signal to the analog unit 103.

When the switching control unit 104 selects the route a1, the D-FF 404*g* inputs the digital operation result through the route a1 of the switch 405*a* from the second digital mixer unit 403*b* included in the digital RF signal generation unit 101. The D-FF 404*g* inputs the second clock signal from the second clock generation unit 402*b*. The D-FF 404*g* outputs the delay signal obtained by delaying the input digital operation result according to the second clock signal to the analog unit 103 through the route a1 of the switch 405*b*.

When the switching control unit 104 selects the route a2, the D-FF 404*h* inputs the digital operation result through the route a2 of the switch 405*a* from the second digital mixer unit 403*b* included in the digital RF signal generation unit 101. The D-FF 404*h* inputs the second clock signal from the second clock generation unit 402*b*. The D-FF 404*h* outputs the delay signal obtained by delaying the input digital operation result according to the second clock signal to the D-FF 404*i*. The D-FF 404*i* inputs the delay signal output from the D-FF 404*h* and the second clock signal. The D-FF 404*i* outputs the delay signal obtained by delaying the digital signal according to the second clock signal to the analog unit 103 through the route a2 of the switch 405*b*.

When the switching control unit 104 selects the route a3, the D-FF 404*j* inputs the digital operation result through the route a3 of the switch 405*a* from the second digital mixer unit 403*b* included in the digital RF signal generation unit 101. The D-FF 404*j* inputs the second clock signal from the second clock generation unit 402*b*. The D-FF 404*j* outputs the delay signal obtained by delaying the input digital operation result according to the second clock signal to the D-FF 404*k*. The D-FF 404*k* inputs the delay signal output from the D-FF 404*j* and the second clock signal. The D-FF 404*k* outputs the delay signal delayed according to the second clock signal to the D-FF 404*l*. The D-FF 404*l* inputs the delay signal output from the D-FF 404*k* and the second clock signal. The D-FF 404*l* outputs the delay signal obtained by delaying the input digital signal according to the second clock signal to the analog unit 103 through the route a3 of the switch 405*b*.

Figure 6:
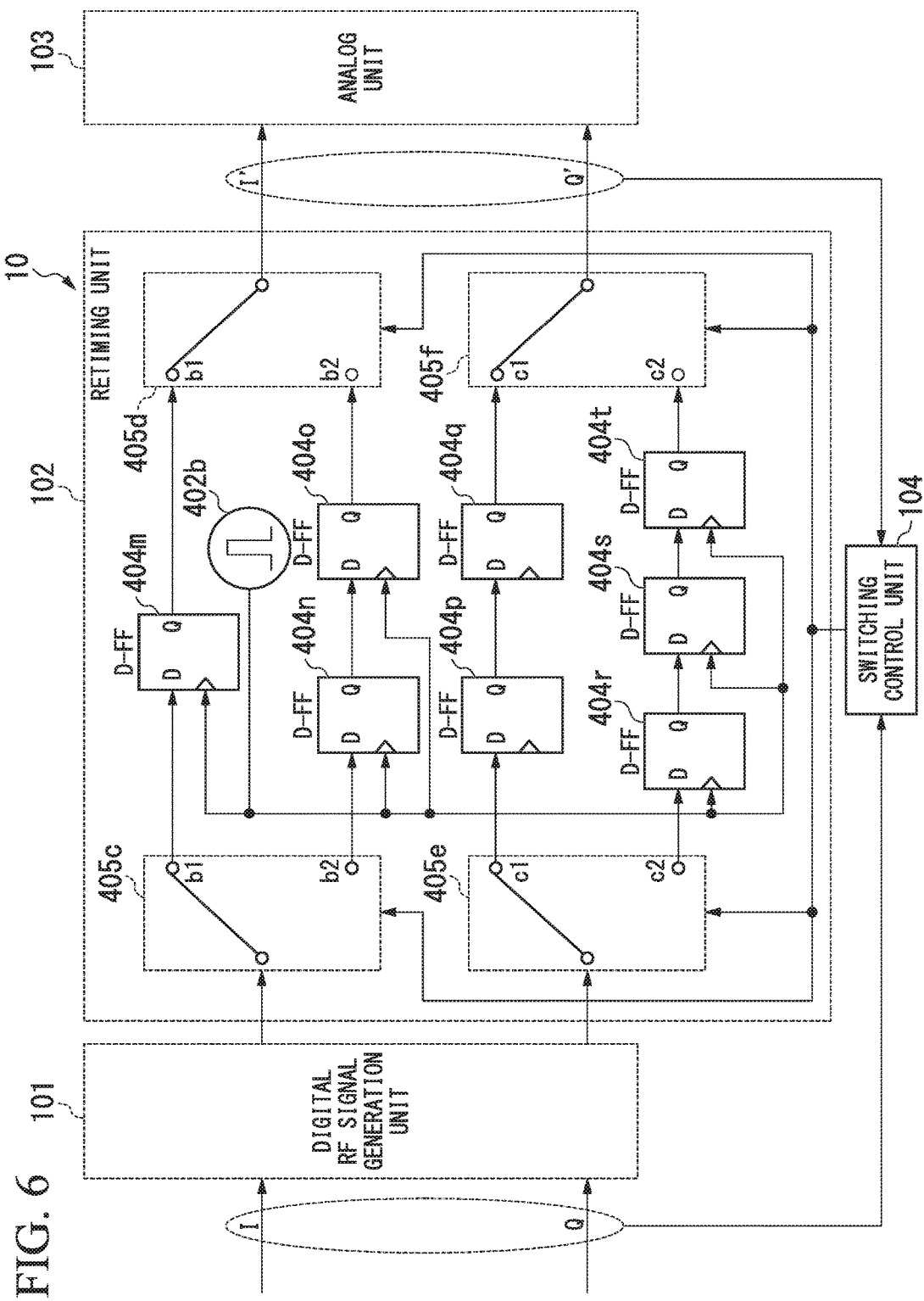
FIG. 6 is a second diagram showing the configuration of the digital transmitter according to the second embodiment.
Figure 7:
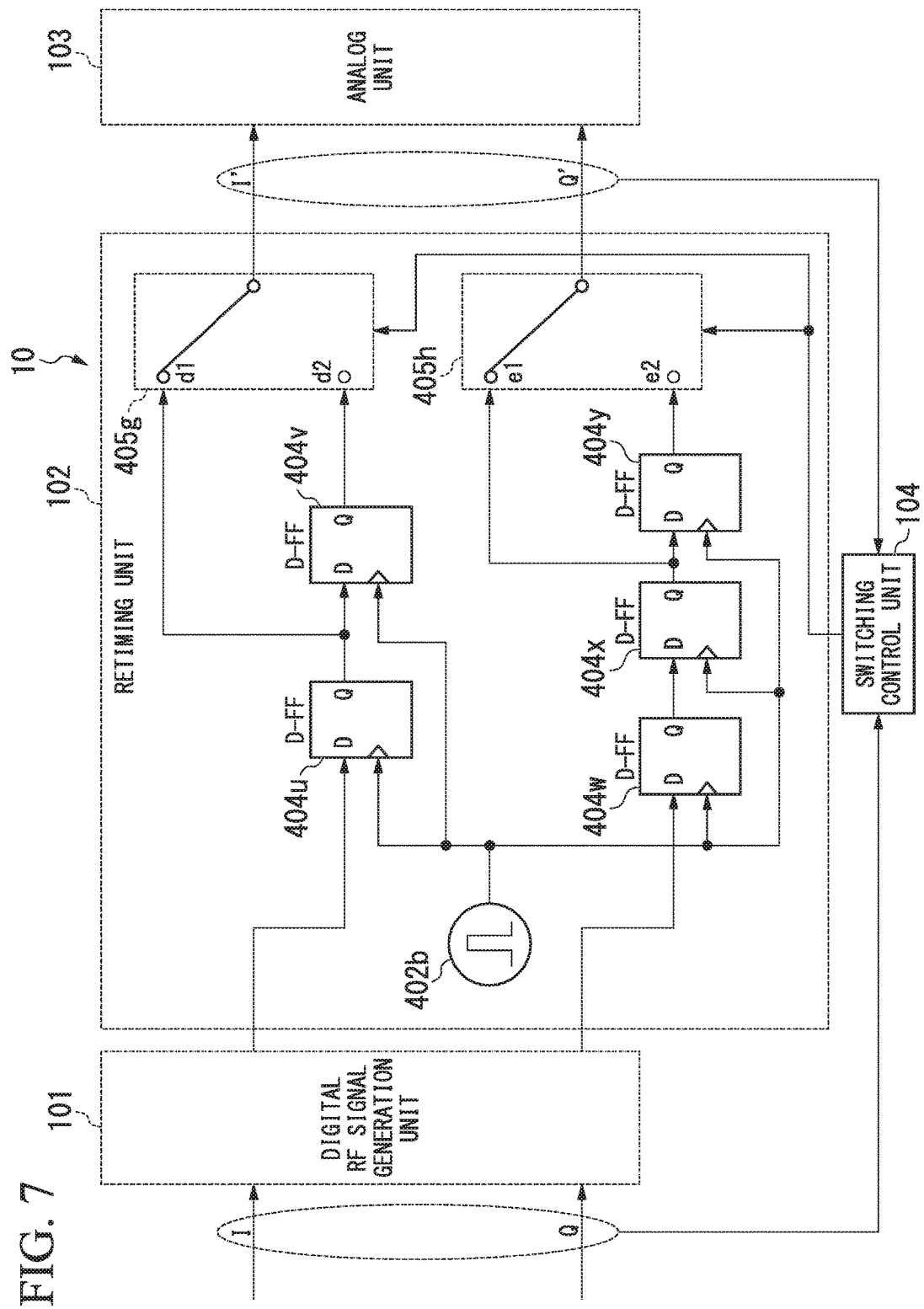
FIG. 7 is a third diagram showing the configuration of the digital transmitter according to the second embodiment.

The routes in the retiming unit 102 are not limited to the routes shown in FIG. 4. As shown in FIG. 6, the routes in the retiming unit 102 may be, for example, a route b1 formed via a D-FF 404*m*, a route b2 formed via D-FFs 404*n* and 404*o*, a route c1 formed via D-FFs 404*p* and 404*q*, and a route c2 formed via D-FFs 404*r*, 404*s*, and 404*t*, these routes selected by switches 405*c*, 405*d*, 405*e*, and 405*f*. As shown in FIG. 7, the routes in the retiming unit 102 may also be, for example, a route d1 formed via a D-FF 404*u*, a route d2 formed via D-FFs 404*u* and 404*v*, a route e1 formed via D-FFs 404*w* and 404*x*, and a route e2 formed via D-FFs 404*w*, 404*x*, and 404*y*, these routes selected by switches 405*g* and 405*h*.

The process of the digital transmitter 10 according to the second embodiment of the present invention has been described above. The above-described digital transmitter 10 includes the retiming unit 102 that includes a first delay circuit delaying a signal corresponding to the I signal and a second delay circuit delaying a signal corresponding to the Q signal. At least one of the first and second delay circuits has a plurality of delay routes in which the number of stages of D-FF (logic circuits or delay elements) is different. In the digital transmitter 10, the switching control unit 104 generates the switching control signal according to the I signal, the Q signal and the two output signals (the I' signal and the Q' signal) corresponding to the I signal and the Q signal output by the retiming unit 102. Each switch unit included in the retiming unit 102 selects one of the plurality of delay routes in accordance with the switching control signal generated by the switching control unit 104.

In this way, in the digital transmitter 10, the retiming unit 102 which is a connection unit of the digital circuit and the analog circuit can correct a deviation in a timing occurring due to a variation or the like in the transmission line length according to the second clock signal with the frequency which is 4n times the carrier frequency and can delay the phase of the second digital RF signal corresponding to the Q signal by 90 degrees with respect to the first digital RF signal corresponding to the I signal. Therefore, it is possible to improve distortion characteristics.

Third Embodiment

A digital transmitter 10 according to a third embodiment of the present invention will be described.

A digital transmitter 10 according to the third embodiment is a digital transmitter that alleviates a problem that a sampling timing is deviated by one clock at random and a signal is biased to a specific route to be distorted since the waveform of the signal output from the digital RF signal generation unit 101 is collapsed and thus does not become a rectangular wave in the specific route.

A configuration of the digital transmitter 10 according to the third embodiment will be described.

Figure 8:
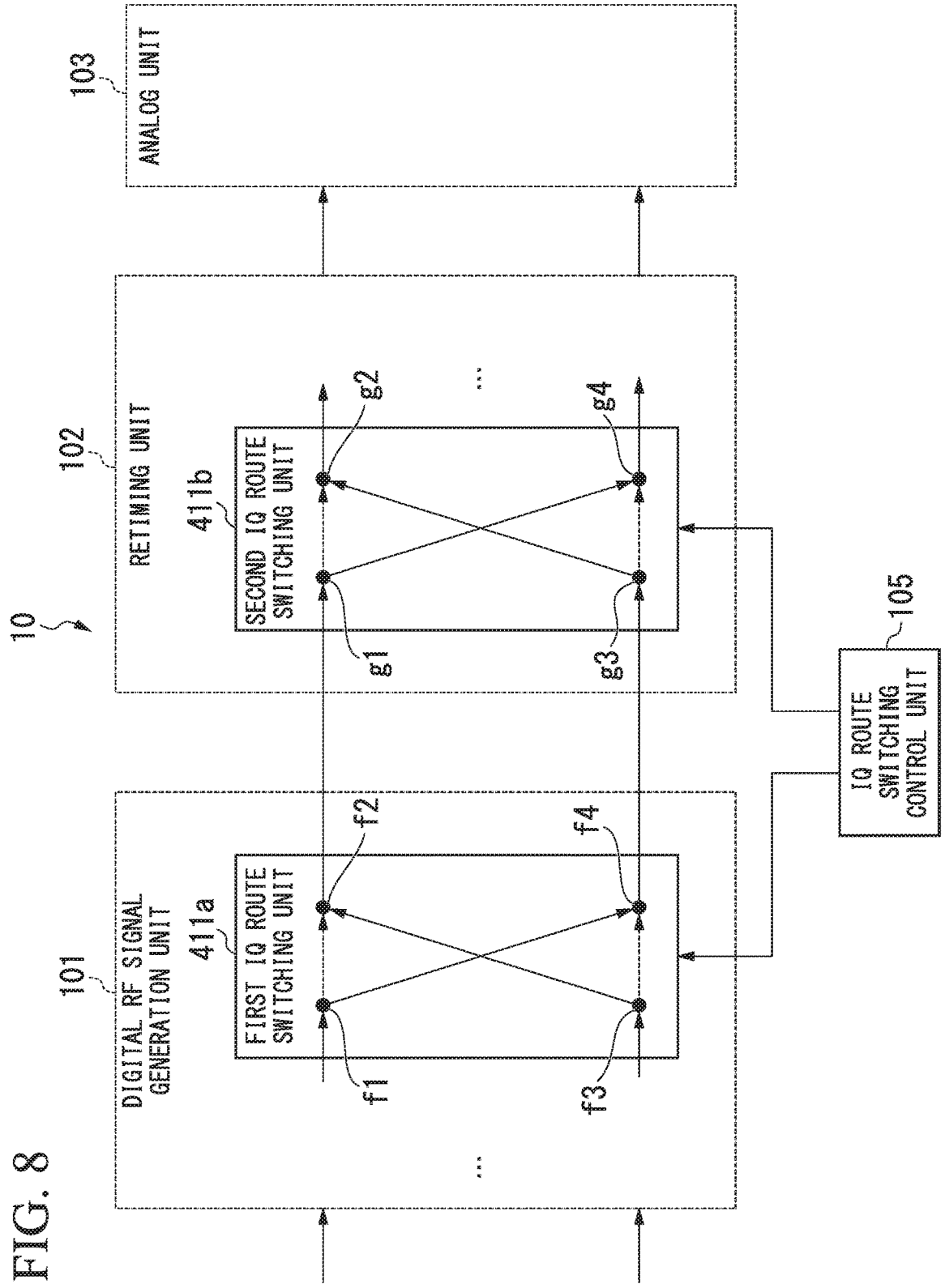
FIG. 8 is a diagram showing a configuration of a digital transmitter according to a third embodiment of the present invention.

As shown in FIG. 8, the digital transmitter 10 according to the third embodiment includes a digital RF signal generation unit 101, a retiming unit 102, an analog unit 103, and an IQ route switching control unit 105.

The digital RF signal generation unit 101 includes a first IQ route switching unit 411*a* at an output end.

The retiming unit 102 includes a second IQ route switching unit 411*b* at an input end.

The IQ route switching control unit 105 outputs an IQ route switching control signal for controlling switching of a route to each of the first IQ route switching unit 411*a* and the second IQ route switching unit 411*b*.

The first IQ route switching unit 411*a* and the second IQ route switching unit 411*b* input the IQ route switching control signal from the IQ route switching control unit 105 and mutually switch an I signal sequence and a Q signal sequence.

Specifically, the first IQ route switching unit 411*a* connects terminals f1 and f2 to output the I signal sequence to the retiming unit 102 and connects terminals f3 and f4 to output the Q signal sequence to the retiming unit 102 according to the IQ route switching control signal input from the IQ route switching control unit 105. Alternatively, the first IQ route switching unit 411*a* connects the terminals f1 and f4 to output the I signal sequence to the retiming unit 102 and connects the terminals f3 and f2 to output the Q signal sequence to the retiming unit 102 according to the IQ route switching control signal input from the IQ route switching control unit 105. The first IQ route switching unit 411*a* exchanges the route through which the I signal sequence and the Q signal sequence are output to the retiming unit 102 according to the IQ route switching control signal.

Specifically, the second IQ route switching unit 411*b* connects terminals g1 and g2 to output a signal sequence (the I signal sequence or the Q signal sequence) input from the terminal f2 to a subsequent-stage circuit and connects terminals g3 and g4 to output a signal sequence (the Q signal sequence or the I signal sequence) input from the terminal f4 to a subsequent-stage circuit according to the IQ route switching control signal input from the IQ route switching control unit 105. Alternatively, the second IQ route switching unit 411*b* connects the terminals g1 and g4 to output a signal sequence (the I signal sequence or the Q signal sequence) input from the terminal f2 to a subsequent-stage circuit and connects terminals g3 and g2 to output a signal sequence (the Q signal sequence or the I signal sequence) input from the terminal f4 to a subsequent-stage circuit according to the IQ route switching control signal input from the IQ route switching control unit 105. The second IQ route switching unit 411*b* exchanges the route through which the I signal sequence and the Q signal sequence input from the digital RF signal generation unit 101 propagate in the retiming unit 102 according to the IQ route switching control signal.

The IQ route switching control unit 105 generates the IQ route switching control signal for switching the first IQ route switching unit 411*a* and the second IQ route switching unit 411*b* so that a route in which the I signal sequence and the Q signal sequence propagate through the D-FFs in a desired number of stages without changing the I signal sequence and the Q signal sequence output from the retiming unit 102 is firmed.

The digital transmitter 10 may further include the switching control unit 104 described in the second embodiment and execute control such that and a route of the I signal sequence and the Q signal sequence propagating through the D-FFs in a desired number of stages is selected without changing the I signal sequence and the Q signal sequence output from the retiming unit 102 in combination of the switching control unit 104 and the IQ route switching control unit 105.

A timing at which the IQ route switching control unit 105 switches the route in each of the IQ route switching units 411*a* and 411*b* in accordance with the IQ route switching control signal is considered to be, for example, a random timing.

Specifically, the IQ route switching control unit 105 generates a random number at a timing of a clock signal (2fc/K) obtained by dividing a frequency 2fc which is twice the carrier frequency fc by K, where K is an integer. Then, when a value of the generated random number exceeds a predetermined threshold, the IQ route switching control unit 105 generates the IQ route switching control signal for switching the route in each of the first IQ route switching unit 411*a* and the second IQ route switching unit 411*b* and output the IQ route switching control signal to each of the first IQ route switching unit 411*a* and the second IQ route switching unit 411*b*. Conversely, when the value of the generated random number does not exceed the predetermined threshold, the IQ route switching control unit 105 outputs the IQ route switching control signal for not switching the route in each of the first IQ route switching unit 411*a* and the second IQ route switching unit 411*b* to the first IQ route switching unit 411*a* and the second IQ route switching unit 411*b*.

The process of the digital transmitter 10 according to the third embodiment of the present invention has been described above. In the above-described digital transmitter 10, the IQ route switching control unit 105 outputs the IQ route switching control signal for controlling the switching of the route. The digital RF signal generation unit 101 includes, at the output end, the first IQ route switching unit 411*a* that switches between the route through which the signal corresponding to the I signal propagates and the route through which the signal corresponding to the Q signal propagates according to the IQ route switching control signal output by the IQ route switching control unit 105. The retiming unit 102 includes, at the input end, the second IQ route switching unit 411*b* that switches between the route through which the signal corresponding to the I signal propagates and the route through which the signal corresponding to the Q signal propagates according to the IQ route switching control signal output by the IQ route switching control unit 105.

In this way, in the digital transmitter 10, between the digital RF signal generation unit 101 which is the connection unit of the digital circuit and the analog circuit, and the first amplifier 406*a* and the second amplifier 406*b*, a probability at which a deviation in a sampling timing occurs in the route through which the signal corresponding to the I signal propagates can be substantially the same as a probability at which a deviation of a sampling timing occurs in the route through the signal corresponding to the Q signal propagates. As a result, it is possible to alleviate the problem that the waveform of the signal output from the digital RF signal generation unit 101 deviates on a specific route and alleviate the problem that the signal is biased to a specific route to be distorted.

The digital transmitter 10 with a minimum configuration according to the present invention will be described.

Figure 9:
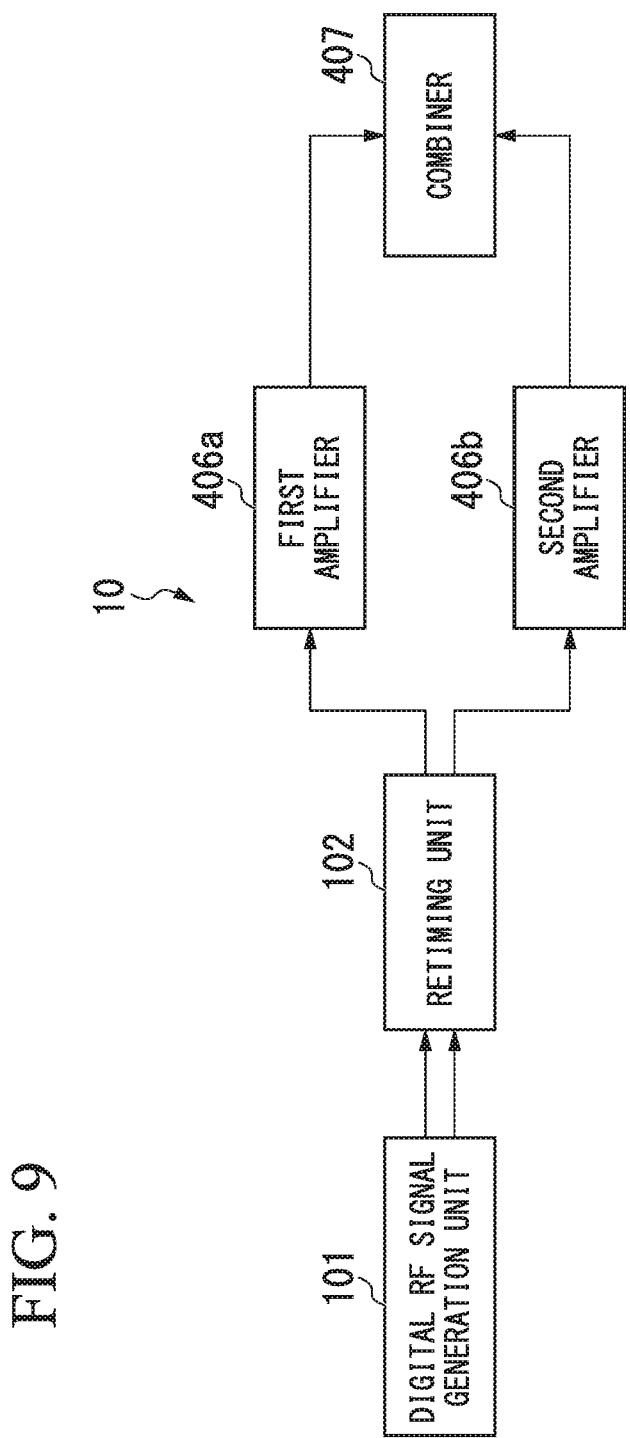
FIG. 9 is a diagram showing a configuration of a digital transmitter with a minimum configuration according to the present invention.

As shown in FIG. 9, the digital transmitter 10 with the minimum configuration according to the present invention includes at least the digital RF signal generation unit 101, the retiming unit 102, the first amplifier 406*a*, the second amplifier 406*b*, and the combiner 407.

The digital RF signal generation unit 101 executes the digital modulation on the I signal which is an input baseband signal to convert the I signal into the first digital RF signal with the bit rate which is twice the carrier frequency and executes the digital modulation on the Q signal which is an input baseband signal to convert the Q signal into the second digital RF signal with a bit rate which is twice the carrier frequency.

The retiming unit 102 delays the first digital RF signal according to the clock signal with the frequency 4n·fc which is 4n times the carrier frequency to output the delayed first digital RF signal and delays the phase of the second digital RF signal by 90 degrees with respect to the output of the first digital RF signal to output the delayed second digital RF signal.

The first amplifier 406*a* amplifies the first digital RF signal output by the retiming unit 102.

The second amplifier 406*b* amplifies the second digital RF signal output by the retiming unit 102.

The combiner 407 combines the first digital RF signal amplified by the first amplifier 406*a* and the second digital RF signal amplified by the second amplifier 406*b* to generate one signal sequence.

The embodiments of the present invention have been described and a computer system is included inside the above-described digital transmitter 10. Then, the operation of the above-described processes is stored in a computer-readable recording medium in a format of a program and the program is read and executed by a computer to execute the foregoing processes. Here, the computer-readable recording medium refers to a magnetic disk, a magneto-optical disc, a CD-ROM, a DVD-ROM, or a semiconductor memory. The computer program may be delivered to a computer via a communication line and the computer to which the computer program is delivered may execute the program.

The program may be a program realizing some of the above-described functions. Further, the above-described functions may be so-called differential files (differential program) which can be realized in combination with a program already recorded on a computer system.

Several embodiments of the present invention have been described, but these embodiments have been proposed as examples and do not limit the scope of the present invention. Various omissions, substitutions, and changes can be made within the scope of the present invention without departing from the gist of the present invention.

Some or all of the foregoing embodiments can be described as in the following supplementary notes, but the present invention is not limited to the following description.

(Supplementary note 1) A digital transmitter including:
a digital RF signal generation unit configured to execute digital modulation on an I signal which is an input baseband signal to convert the I signal into a first digital RF signal with a bit rate which is twice a carrier frequency and execute digital modulation on a Q signal which is an input baseband signal to convert the Q signal into a second digital RF signal with a bit rate which is twice the carrier frequency;
a retiming unit configured to delay the first digital RF signal according to a first clock signal with a frequency which is 4n times the carrier frequency to output the delayed first digital RF signal and delay the phase of the second digital RF signal by 90 degrees with respect to an output of the first digital RF signal to output the delayed second digital RF signal, n being an integer;
a first amplifier configured to amplify the first digital RF signal output by the retiming unit;
a second amplifier configured to amplify the second digital RF signal output by the retiming unit; and
a combiner configured to combine the first digital RF signal amplified by the first amplifier and the second digital RF signal amplified by the second amplifier to generate one signal sequence.

(Supplementary note 2) The digital transmitter described in Supplementary note 1, further including:
an IQ route switching control unit configured to output an IQ route switching control signal for controlling switching of a route,
wherein the digital RF signal generation unit includes, at an output end, a first IQ route switching unit configured to switch routes along which the first and second digital RF signals propagate to the retiming unit according to the IQ route switching control signal output by the IQ route switching control unit, and
wherein the retiming unit includes, at an input end, a second IQ route switching unit configured to switch routes along which the first and second digital RF signals are input according to the IQ route switching control signal output by the IQ route switching control unit.

(Supplementary note 3) The digital transmitter described in Supplementary note 2,
wherein the IQ route switching control unit determines at random whether the first and second IQ route switching units switch the routes by generating a random number at a timing of a second clock signal with a frequency which is 2/K times the carrier frequency, K being an integer.

(Supplementary note 4) The digital transmitter described in any one of Supplementary notes 1 to 3,
wherein the retiming unit includes
a clock generation unit configured to generate the first clock signal,
a first delay circuit in which one or more logic circuits delaying a first digital RF signal according to the clock signal generated by the clock generation unit are connected in series, the first delay circuit including a single logic circuit or a plurality of logic circuits connected in series delaying the first digital RF signal according to the first clock signal generated by the clock generation unit, and
a second delay circuit configured to include a circuit delaying the second digital RF signal according to the first clock signal, the circuit including the number of logic circuits connected in series which is n more than the number of logic circuits included in the first delay circuit.

(Supplementary note 5) The digital transmitter described in Supplementary note 4,
wherein the first delay circuit further includes a single logic circuit or a plurality of logic circuits connected in series delaying the first digital RF signal according to a third clock signal obtained by dividing the first clock signal generated by the clock generation unit by 2n,
wherein the second delay circuit further includes a single logic circuit or a plurality of logic circuits connected in series delaying the second digital RF signal according to the third clock signal, and
wherein the number of logic circuits delaying the first digital RF signal according to the third clock signal is the same as the number of logic circuits delaying the second digital RF signal according to the third clock signal.

(Supplementary note 6) The digital transmitter described in Supplementary notes 4 or 5,
wherein at least one of the first and second delay circuits includes a plurality of delay routes formed from logic circuits, and
wherein the digital transmitter further includes:
a switching control unit configured to generate a control signal according to the I signal, the Q signal, and the delayed first and second digital RF signals output by the retiming unit; and
a switch unit configured to select one of the plurality of delay routes in accordance with the control signal generated by the switching control unit.

(Supplementary note 7) The digital transmitter described in Supplementary note 6,
wherein the second delay circuit has three delay routes, a delay route formed by the same number of logic circuits as the number of logic circuits forming the delay route in the first delay circuit, a delay route formed by the number of logic circuits which is 1 more than the number of logic circuits in the first delay circuit, and a delay route formed by the number of logic circuits which is 2 more than the number of logic circuits in the first delay circuit, and
wherein the switching control unit generates the control signal for selecting one of the three delay routes in the second delay circuit.

(Supplementary note 8) The digital transmitter described in Supplementary notes 6 or 7,
wherein the switching control unit generates the control signal for causing the switch unit to select the delay route along which the delayed second digital RF signal output from the retiming unit is delayed by 90 degrees with respect to the delayed first digital RF signal output from the retiming unit when the I signal and the Q signal are the same signal.

(Supplementary note 9) The digital transmitter described in any one of Supplementary notes 4 to 8, wherein the logic circuit includes at least a latch.

(Supplementary note 10) The digital transmitter according to any one of Supplementary notes 4 to 9, wherein the logic circuit includes at least a flip-flop.

(Supplementary note 11) The digital transmitter according to any one of Supplementary notes 4 to 10, wherein the logic circuit includes at least a D flip-flop.

Priority is claimed on Japanese Patent Application No. 2015-195894, filed Oct. 1, 2015, the content of which is incorporated herein by reference.

INDUSTRIAL APPLICABILITY

The present invention can be applied to a use in which a low manufacturing cost and an improvement in distortion characteristics are necessary.

REFERENCE SIGNS LIST

10 Digital transmitter
101 Digital RF signal generation unit
102 Retiming unit
103 Analog unit
104 Switching control unit
105 IQ route switching control unit
401a First ΔΣ modulation unit
401b Second ΔΣ modulation unit
402a First clock generation unit
402b Second clock generation unit
403a First digital mixer unit
403b Second digital mixer unit
404a, 404b, 404c, 404d, 404e, 404f, 404g, 404h, 404i, 404j, 404k, 404l, 404m, 404n, 404o, 404p, 404q, 404r, 404s, 404t, 404u, 404v, 404w, 404x, 404y D flip-flop
405a, 405b, 405c, 405d, 405e, 405f, 405g, 405h Switch
406a First amplifier
406b Second amplifier
407 Combiner
408 Band-pass filter
409 Antenna
410 2-divider
411a First IQ route switching unit
411b Second IQ route switching unit

What is claimed is:

1. A digital transmitter comprising:
a digital radio frequency (RF) signal generation unit configured to execute digital modulation on an in-phase (I) signal which is an input baseband signal to convert the I signal into a first digital RF signal with a bit rate which is twice a carrier frequency and execute digital modulation on a quadrature (Q) signal which is an input baseband signal to convert the Q signal into a second digital RF signal with a bit rate which is twice the carrier frequency;
a retiming unit configured to delay the first digital RF signal according to a first clock signal with a frequency which is 4n times the carrier frequency to output the delayed first digital RF signal and delay the phase of the second digital RF signal by 90 degrees with respect to an output of the first digital RF signal to output the delayed second digital RF signal, n being an integer;
a first amplifier configured to amplify the first digital RF signal output by the retiming unit;
a second amplifier configured to amplify the second digital RF signal output by the retiming unit; and
a combiner configured to combine the first digital RF signal amplified by the first amplifier and the second digital RF signal amplified by the second amplifier to generate one signal sequence.

2. The digital transmitter according to claim 1, further comprising:
an IQ route switching control unit configured to output an IQ route switching control signal for controlling switching of a route,
wherein the digital RF signal generation unit includes, at an output end, a first IQ route switching unit configured to switch routes along which the first and second digital RF signals propagate to the retiming unit according to the IQ route switching control signal output by the IQ route switching control unit, and
wherein the retiming unit includes, at an input end, a second IQ route switching unit configured to switch routes along which the first and second digital RF signals are input according to the IQ route switching control signal output by the IQ route switching control unit.

3. The digital transmitter according to claim 2,
wherein the IQ route switching control unit determines at random whether the first and second IQ route switching units switch the routes by generating a random number at a timing of a second clock signal with a frequency which is 2/K times the carrier frequency, K being an integer.

4. The digital transmitter according to claim 1,
wherein the retiming unit includes:
a clock generation unit configured to generate the first clock signal,
a first delay circuit configured to include a single logic circuit or a plurality of logic circuits connected in series delaying the first digital RF signal according to the first clock signal, and
a second delay circuit configured to include a circuit delaying the second digital RF signal according to the first clock signal, the circuit including the number of logic circuits connected in series which is n more than the number of logic circuits included in the first delay circuit.

5. The digital transmitter according to claim 4,
wherein the first delay circuit further includes a single logic circuit or a plurality of logic circuits connected in series delaying the first digital RF signal according to a third clock signal obtained by dividing the first clock signal generated by the clock generation unit by 2n,
wherein the second delay circuit further includes a single logic circuit or a plurality of logic circuits connected in series delaying the second digital RF signal according to the third clock signal, and
wherein the number of logic circuits delaying the first digital RF signal according to the third clock signal is the same as the number of logic circuits delaying the second digital RF signal according to the third clock signal.

6. The digital transmitter according to claim 4,
wherein at least one of the first and second delay circuits includes a plurality of delay routes formed from logic circuits, and wherein the digital transmitter further comprises:
a switching control unit configured to generate a control signal according to the I signal, the Q signal, and the delayed first and second digital RF signals output by the retiming unit; and
a switch unit configured to select one of the plurality of delay routes in accordance with the control signal generated by the switching control unit.

7. The digital transmitter according to claim 6,
wherein the second delay circuit has three delay routes, a delay route formed by the same number of logic circuits as the number of logic circuits forming the delay route in the first delay circuit, a delay route formed by the number of logic circuits which is 1 more than the number of logic circuits in the first delay circuit, and a delay route formed by the number of logic circuits which is 2 more than the number of logic circuits in the first delay circuit, and wherein the switching control unit generates the control signal for selecting one of the three delay routes in the second delay circuit.

8. The digital transmitter according to claim 6,
wherein the switching control unit generates the control signal for causing the switch unit to select the delay route along which the delayed second digital RF signal output from the retiming unit is delayed by 90 degrees with respect to the delayed first digital RF signal output from the retiming unit when the I signal and the Q signal are the same signal.

9. The digital transmitter according to claim 4,
wherein the logic circuit includes at least a latch.

10. The digital transmitter according to claim 4,
wherein the logic circuit includes at least a D flip-flop.

\* \* \* \* \*